United States Patent [19]

Inada et al.

[11] Patent Number: 5,326,747
[45] Date of Patent: Jul. 5, 1994

[54] PROCESS FOR PATTERNING LAYERED THIN FILMS INCLUDING A SUPERCONDUCTOR

[75] Inventors: Hiroshi Inada; Michitomo Iiyama, both of Osaka, Japan

[73] Assignee: Sumitomo Electric Industries, Ltd., Osaka, Japan

[21] Appl. No.: 865,498

[22] Filed: Apr. 9, 1992

[30] Foreign Application Priority Data

| Apr. 9, 1991 | [JP] | Japan | 3-103955 |
| Apr. 10, 1991 | [JP] | Japan | 3-104655 |
| Apr. 10, 1991 | [JP] | Japan | 3-104656 |
| Apr. 10, 1991 | [JP] | Japan | 3-104657 |

[51] Int. Cl.$^5$ ............................................. H01L 21/00
[52] U.S. Cl. ..................................... 505/413; 505/725; 505/728; 505/730; 156/655; 427/62
[58] Field of Search .............. 505/728, 725, 730, 700, 505/1; 156/655, 656; 427/62

[56] References Cited

U.S. PATENT DOCUMENTS 5,106,823  4/1992  Creuzet et al. ..................... 505/1

FOREIGN PATENT DOCUMENTS

| 332218 | 9/1989 | European Pat. Off. ............ 505/728 |
| 0397186 | 11/1990 | European Pat. Off. . |
| 0419361 | 3/1991 | European Pat. Off. . |
| 0444893 | 9/1991 | European Pat. Off. . |
| 0476817 | 3/1992 | European Pat. Off. . |
| 118063 | 5/1990 | Japan ................................. 505/728 |

OTHER PUBLICATIONS

Jia et al., "SiO$_2$ and Si$_3$N$_4$ Passivation Layers on Y-Ba-Cu-O Thin Films," *J. Appl. Phys.*, vol. 66, No. 1, pp. 452-454 (Jul. 1989).

*Primary Examiner*—Thi Dang
*Attorney, Agent, or Firm*—Foley & Lardner

[57] ABSTRACT

A process for patterning layered thin films comprising a bottom oxide superconductor (1) layer deposited on a substrate (3) and another thin film (2) deposited on the bottom superconductor layer and consisting of insulator, ordinary conductor or oxide superconductor having a different crystal orientation from the bottom superconductor layer. The bottom superconductor layer (1) is subjecting to heat-treatment before another thin film (2) is deposited thereon. The heat-treatment can be carried out under a first condition in ultra high-vacuum at a temperature which is lower than the oxygen-trap temperature ($T_{trap}$) at which oxygen can enter into the oxide superconductor but is higher than a temperature which is lower by 100° C. than the oxygen-trap temperature ($T_{trap}-100°$ C.) or under a second condition in an atmosphere containing oxygen of high purity at a temperature which is higher than the oxygen-trap temperature ($T_{trap}$) but is lower than a film forming temperature of the first thin film of oxide superconductor.

23 Claims, 1 Drawing Sheet

PROCESS FOR PATTERNING LAYERED THIN FILMS INCLUDING A SUPERCONDUCTOR

BACKGROUND OF THE INVENTION

1. Field of the Invention

The present invention relates to a process for patterning layered thin films including at least one superconductor layer.

More particularly, the present invention relates to an improved patterning process for layered thin films comprising a bottom superconductor layer deposited on a substrate and another thin film deposited on the bottom superconductor layer and consisting of insulator, ordinary conductor or a second thin film of oxide superconductor having a different crystal orientation from the bottom superconductor layer.

2. Description of the Related Art

Oxide superconductors are expected to be used in a variety of applications due to their higher critical temperatures than conventional metal superconductors. In fact, Y-Ba-Cu-O oxide superconductor possesses the critical temperature above 80 K and Bi-Sr-Ca-Cu-O Tl-Ba-Ca-Cu-O oxide superconductors possesses those of above 100 K.

When the oxide superconductors are used in superconducting devices, it is indispensable to deposit a first thin film of oxide superconductor on a substrate and then to deposit at least one different thin film on the first thin film of oxide superconductor. The first thin film of oxide superconductor deposited directly or through buffer layer(s) on a substrate is called a bottom superconductor layer.

For example, in a superconducting junction so-called tunnel type Josephson Junction realized with oxide superconductor, it is requested to deposit the bottom superconductor layer, an intermediate layer of non-superconductor and a top superconductor layer on a common substrate successively in this order. Josephson element is a two-terminals element, so that a logical circuit consisting of Josephson junctions alone becomes complicated. In order to overcome this demerit of complexity, a variety of ideas of three-terminals elements are proposed.

In the superconductor transistors consisting of superconductor and semiconductor which is a typical three-terminals element, it is also required to combine a thin film of oxide superconductor with a thin film of semiconductor and hence successive deposition of thin films each consisting of different material is required. Successive deposition of a thin film of ordinary conductor such as metal onto the bottom superconductor layer is required also in the other type superconducting element consisting of superconductor and the ordinary conductor.

In these superconducting elements, a superconducting current passes through a thin film of the ordinary conductor or non-superconductor sandwiched between two adjacent layers of superconductors positioned close to each other. A distance between two adjacent superconductors is determined by the coherence length of superconductor. Since the coherence length of oxide superconductors is very short, the distance between two adjacent superconductors must be several nanometer.

In a layered thin film structure, each thin film is often requested to be patterned into a desired dimension and/or configuration according to its function and application.

Successive deposition of thin films onto the bottom superconducting layer must be carried out carefully in such a manner that the thin film of oxide superconductor is not deteriorated or badly influenced. In particular, when the oxide superconductor is exposed to air, composition and crystal structure of the oxide superconductor are easily spoiled, resulting in that the superconducting properties are extremely lowered.

For example, a thin film of metal is patterned into a shape of bonding pads each having a predetermined pattern at predetermined position on a superconducting thin film. The bonding pad functions as electrodes for the superconducting thin film. The thin film of metal is used also as a resistance in a superconducting circuit. In this case also, the thin film of metal which may have a thickness of less than 100 nm must be patterned into a predetermined shape without unnecessary resistance at an interface between the metal thin film and the superconducting thin film. Patterning of a thin film of oxide superconductor is also necessary in superconducting devices or integrated superconducting circuits having superconducting wiring lines.

When more than two thin films are deposited successively on a common substrate, it is usual practice to subject a surface of a bottom layer to cleaning operation before another layer is grown thereon, otherwise an undesirable junction due to contaminants adsorbed on the surface of the bottom layer or undesirable oxides produced thereon is formed at an interface between two layers and continuity of crystal growth is destroyed locally at the interface. Devices or integrated circuits having such undesirable junction or discontinuity do not show desired performance and sometimes do not work.

In the case of oxide superconductor, the surface condition of the bottom superconductor layer should be considered particularly and carefully, because the coherence length of oxide superconductors is very short. Therefore, the surface of bottom superconductor layer must be cleaned without spoiling its superconducting property and also must have well-ordered crystallinity or superconducting property.

In the field of semiconductor industries, surfaces of thin films are cleaned usually with ultra-pure water, by chemical washing, dry or wet etching or the like. In the case of oxide superconductors, however, these clearing technique can not be used due to high reactivity of oxide superconductors. If the surface of thin film of oxide superconductor is treated by these known techniques, undesirable reaction occur on the surface, resulting in that cleanness of the surface become worse and crystallinity and superconducting property are lost.

Under certain film forming conditions, constituent elements of the top superconductor layer diffuse or migrate into the bottom superconductor layer, resulting in that an interface between adjacent two layers become unclear and the bottom superconductor layer is deteriorated.

The patterning operation of each thin film in the layered structure must be carried out carefully. In particular, when a thin film deposited directly on the bottom superconductor layer is patterned, there is such a danger that oxide superconductor of the bottom superconductor layer is deteriorated seriously. In fact, if such thin film is patterned by lift-off technique with photoresist and etching liquid, the bottom superconductor layer is badly influenced with them. Pattering by beam-etching technique with Cl ions beam, electron beam or the like also damage the thin film.

An object of the present invention is to solve the problems and to provide an improved process for patterning layered thin films comprising a first thin film of oxide superconductor or the bottom superconducting layer deposited on a substrate and another thin film having a predetermined pattern, both being deposited at predetermined position(s) on the substrate on this order without deteriorating the first thin film of oxide superconductor.

SUMMARY OF THE INVENTION

The present invention provides a process for patterning layered thin films comprising a bottom oxide superconductor layer deposited on a substrate and another thin film deposited on the bottom superconductor layer and consisting of insulator, ordinary conductor or oxide superconductor having a different crystal orientation from the bottom superconductor layer, characterized by the steps of subjecting the bottom superconductor layer to heat-treatment under predetermined conditions, depositing another thin film all over a surface of the heat-treated bottom superconductor layer, and then carrying out patterning operation of the another thin film at predetermined area thereof.

An essence of the present invention resides in that the bottom superconductor layer is heat-treated before another thin film is deposited and then another thin film is deposited. The surface of the heat-treated bottom superconductor layer is totally covered with another thin film and then patterning is effected to another thin film, so that the bottom superconductor layer is not exposed to surrounding in a patterning apparatus and hence the bottom superconductor layer is not deteriorated during patterning operation.

The pattering of the bottom superconductor layer can be carried out at the same time as the patterning of above-mentioned another thin film.

The heat-treatment of the bottom superconductor layer must be carried out under one of the following conditions (1) and (2):

(1) The bottom superconductor layer is heat-treated in ultra high-vacuum at a temperature which is lower than the oxygen-trap temperature ($T_{trap}$) at which oxygen can enter into said oxide superconductor but is higher than a temperature which is lower by 100° C. than said oxygen-trap temperature ($T_{trap}-100°$ C.) The bottom superconductor layer is heat-treated in an atmosphere containing oxygen of high purity at a temperature which is higher than the oxygen-trap temperature ($T_{trap}$) but is lower than a film forming temperature of said first thin film of oxide superconductor.

The oxygen-trap temperature ($T_{trap}$) and the film forming temperature are both known for respective oxide superconductors.

The process according to the present invention is applicable to any known oxide superconductors and is advantageously applicable to Y-Ba-Cu-O oxide superconductor, Bi-Sr-Ca-Cu-O oxide superconductor and Tl-Ba-Ca-Cu-O oxide superconductor which have the most attractive properties including their high critical temperatures. In a preferred embodiment, the bottom superconductor layer is a c-axis oriented thin film of $Y_1Ba_2Cu_3O_{7-x}$ ($x=\pm 1$).

The above-mentioned another thin film can be made of non-superconductor such as metal, preferably Au.

The substrate is preferably a single crystal of oxide such as MgO, StTiO$_3$, PrGaO$_3$ or the like.

In the process according to the present invention, both of the bottom superconductor layer and another thin film layer are preferably prepared in a single chamber successively, so that the bottom superconducting layer does not contact with air and hence a surface of the bottom superconductor layer is neither contaminated nor deteriorated by a reaction with moisture in air. However, the process according to the present invention is applicable also for such a case that a surface of the bottom superconductor layer is contaminated with contaminants such as hydrocarbons or metal carbides adsorbed or deposited on the surface. These contaminants are produced when the substrate on which the bottom superconductor layer is formed is taken out of a chamber and is transferred to a separate chamber in which another thin film is to be deposited on the bottom superconductor layer.

According to the present invention, the bottom superconductor layer must be heat-treated under one of the conditions (1) and (2) before another thin film is deposited and is subjected to patterning operation.

In the condition (1), the heat-treatment must be carried out at a temperature which is lower than the oxygen-trap temperature ($T_{trap}$) but is higher than a temperature which is lower by 100° C. than said oxygen-trap temperature ($T_{trap}-100°$ C.) and is carried out preferably in ultra high-vacuum of lower than $1 \times 10^{-9}$ Torr. Advantage of the present invention can not be expected at a vacuum of higher than $1 \times 10^{-9}$ Torr.

Time duration of the heat-treatment depend on the pressure and the heating temperature is usually between several minutes and several hours.

When the deposition of another thin film is carried out in the above-mentioned temperature range, oxygen atoms do not escape out of oxide superconductor and diffusion of constituent elements of another thin film into the bottom superconductor layer can be prevented effectively.

For example, when the bottom superconductor layer is a thin film of Y-Ba-Cu-O oxide superconductor, deposition of the second thin film is carried out with heating the substrate at a temperature range between 350° C. and 400° C. If the heating temperature is not higher than 350° C., contaminants on the surface of thin film oxide superconductor can not be removed and, if the heating temperature exceed 400° C., oxygen escape out of the thin film of oxide superconductor and is lost.

In the condition (2), the heat-treatment must be carried out in an atmosphere containing oxygen having preferably the purity of higher than 5N (99.999%) at a temperature which is higher than the oxygen-trap temperature ($T_{trap}$) but is lower than a film forming temperature of said first thin film of oxide superconductor. Existence of $H_2O$ and $CO_2$ in oxygen deteriorates the oxide superconductor, because they react easily with the oxide superconductor, so that $H_2O$ and $CO_2$ should be eliminated to the limit. A partial pressure of oxygen during the heat-treatment is preferably between 20 mTorr and 100 mTorr.

Under this condition (2) and when the bottom superconductor layer is a c-axis oriented thin film of $Y_1Ba_2Cu_3O_{7-x}$, the heat-treatment is carried out preferably at a temperature range between 400° C. and 700° C. If the heating temperature is not higher than 400° C., the thin film doesn't recover a crystallized surface and, if the heating temperature exceed 700° C., order of crystal of the thin film of oxide superconductor is disturbed. Time duration of the heat-treatment depend on the partial pressure of oxygen and also the heating temperature and is usually between several minutes and several hours.

If the bottom superconductor layer has a contaminated surface, the heat-treatment is effected preferably above an evaporation temperature of contaminants. So, heating condition must be selected depending on what kinds of contaminations are deposited.

Superconducting devices and superconducting integrated circuits fabricated from the layered thin films prepared by the present invention show stable performance because of improvement at the interface between the bottom superconductor layer and another thin film and shows improved mechanical strength due to absence of undesired intermediate layer at the interface.

The process according to the present invention is useful for fabricating a superconducting element comprising a bottom superconductor layer, an intermediate layer made of insulator or ordinary conductor and a top superconductor layer having a different crystal orientation. The patterned stratified thin films prepared by the process according to the present invention show improved crystallinity and continuity especially at a superconducting interface, which is requested for realizing superconducting elements or integrated superconducting circuits and also for realizing high-performance superconducting systems.

BRIEF DESCRIPTION OF THE DRAWING

FIG. 1A shows a substrate (3) on which patterned thin films are to be deposited successively by the process according to the present invention.

Figure 1A:
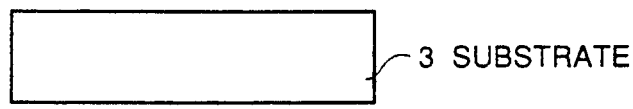
FIGS. 1A–1E illustrate successive steps for preparing a patterned layered structure containing at least one thin film of oxide superconductor by the process according to the present invention.
Figure 1B:
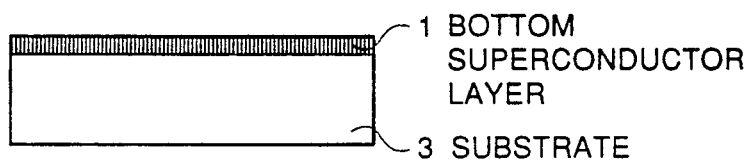

At first, a bottom superconductor layer (1) is deposited on the substrate (3) by any one of known techniques such as off-axis sputtering method, laser abrasion method, reacting evaporation method, MBE or CVD technique (FIG. 1B).

Figure 1C:
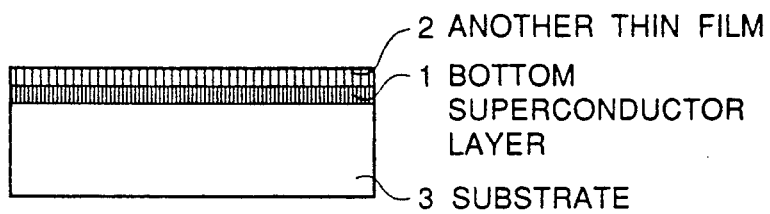

Then, another thin film (2) such as a thin film of Au is deposited in the same sputtering chamber or in a separate chamber whole over the bottom superconductor layer (1) by any one of known techniques such as sputtering method, laser abrasion method, evaporation method, MBE or CVD technique or the like (FIG. 1C). However, according to the present invention, the bottom superconductor layer (1) must be heat-treated under one of the conditions (1) and (2) before another thin film (2) is deposited.

In the condition (1) according to the present invention, the chamber is evacuated under a background pressure of lower than $1 \times 10^{-9}$ Torr and the substrate temperature is adjusted at a temperature which is lower than the oxygen-trap temperature ($T_{trap}$) but is higher than a temperature which is lower by 100° C. than said oxygen-trap temperature ($T_{trap} - 100°$ C.).

In the condition (2) according to the present invention, the chamber is filled with high-purity oxygen having the purity of higher than 5N (99.999%) and the substrate temperature is adjusted at a temperature which is higher than the oxygen-trap temperature ($T_{trap}$) but is lower than a film forming temperature of the bottom superconductor layer.

Figure 1D:
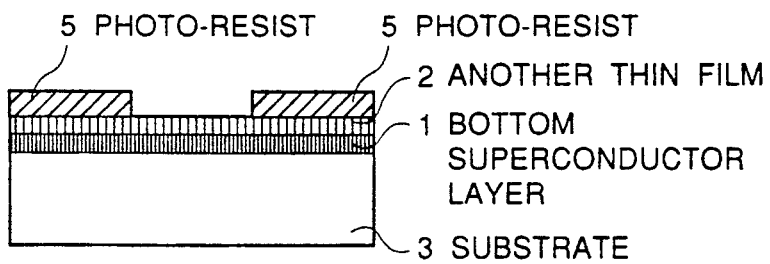

Another thin film (2) is then patterned. In a preferred embodiment, at first, a surface of thin film (2) is coated, for example, with positive-type photo-resist (5) of quinodiazido type. The photo-resist is pre-baked at 80° C. for one minute to be dried. The pre-baked photo-resist film is irradiated with light through a mask and then developed. Finally, photo-resist film is post-baked at a temperature range between 150° C. to 200° C. for one minute (FIG. 1D).

Figure 1E:
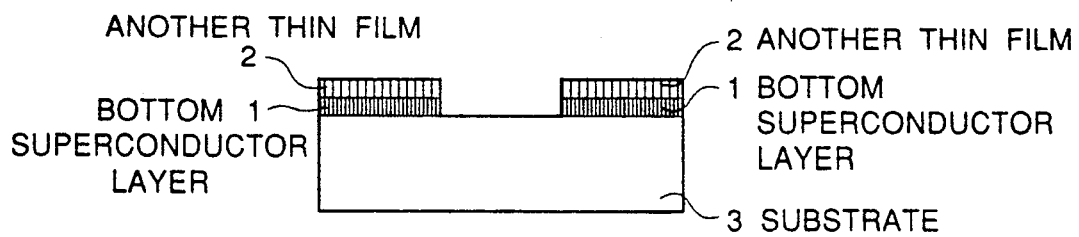

The, reactive ion etching is carried out onto the obtained patterned photo-resist layer (5) so that the thin film (2) is etched (FIG. 1E). The bottom superconductor layer (1) can be etched at the same time as the etching of the thin film (2).

DESCRIPTION OF THE PREFERRED EMBODIMENT

Now, the present invention will be described with referring to Examples but the scope of the invention should not be limited thereto.

EXAMPLE 1

Condition 1

A thin film of Au is deposited on a thin film of oxide superconductor of $Y_1Ba_2Cu_3O_{7-x}$ by a process illustrated in FIGS. 1A–1E.

At first, a substrate (3) of MgO (100) is placed in a ultra-high vacuum chamber which is then evacuated to $1 \times 10^{-6}$ Torr (FIG. 1A).

Then, oxygen gas and argon gas are introduced in the chamber.

A c-axis oriented thin film of oxide superconductor of $Y_1Ba_2Cu_3O_{7-x}$ (1) having a thickness of 300 nm is deposited on the substrate (3) of MgO (100) by off-axis sputtering method under following operational conditions:

Sputtering gas
  Ar: 90%
  O$_2$: 10%
Pressure: 10 Pa
Substrate temperature: 700° C.

After deposition complete, the substrate temperature is adjusting at around 400° C. so that oxygen atoms enter into the bottom superconductor layer of $Y_1Ba_2Cu_3O_{7-x}$ (1).

After the heat-treatment, the substrate temperature is lowered to 375° C. and the chamber is evacuated down to $1 \times 10^{-9}$ Torr. After that, a thin film of Au (2) is deposited up to a thickness of 200 nm by evaporation method (FIG. 1C). Then, a patterned photo-resist layer (5) is formed on the thin film of Au (2) (FIG. 1D) under following conditions:

Photo-resist: OFPR-800
thickness: 0.7 μm (700 nm)
Pre-bake: 110° C., 90 sec
Exposure: 3 to 5 sec, UV
Post bake: 130° C., 5 min.

Finally, both of the thin film of Au (2) and the bottom superconductor of $Y_1Ba_2Cu_3O_{7-x}$ (1) are etched by reacting ion etching technique (FIG. 1E).

All of these procedures are carried out in a single chamber successively. The layers prepared by the process according to the present invention possess improved crystallinity and show continuity at the interface even after the pattering operation.

EXAMPLE 2

Condition 1

Example 1 is repeated but deposition of the Au thin film is carried out in a separate chamber, so that the bottom superconductor layer has a contaminated surface.

Namely, after the bottom superconductor layer of $Y_1Ba_2Cu_3O_{7-x}$ (1) is deposited and after the optional heat-treatment at around 400° C. is finished, the substrate (3) is transferred into an ultra-high vacuum chamber. When the substrate (3) taken out of a sputtering chamber, a surface of the bottom superconductor layer (1) is contaminated or deteriorated.

The bottom superconductor layer with contaminated surface is placed in a ultra-high vacuum chamber which is then vacuumed at a pressure of lower than $1 \times 10^{-9}$ Torr, and is heat-treated under following conditions:

Pressure: lower than $1 \times 10^{-9}$ Torr
Heating temperature: 350° to 400° C. (substrate temperature)
Heating time: 10 min.

After the heat-treatment, a thin film of Au (2) is deposited up to a thickness of 200 nm by evaporation method (FIG. 1C). Then, a patterned photo-resist layer (5) is formed on the thin film of Au (2) (FIG. 1D). Finally, both of the thin film of Au (2) and the thin film of oxide superconductor of $Y_1Ba_2Cu_3O_{7-x}$ (1) are etched by reacting ion etching technique (FIG. 1E).

The layers prepared by the process according to the present invention possess improved crystallinity and show an improved lattice matching at an interface even after the pattering operation.

EXAMPLE 3

Condition 2

Example 3 is effected under the condition (2) for depositing a patterned thin film of Au on a bottom superconductor layer of $Y_1Ba_2Cu_3O_{7-x}$ by the process illustrated in FIGS. 1A-1E.

At first, a substrate (3) of MgO (100) is placed in a ultra-high vacuum chamber which is then evacuated to $1 \times 10^{-6}$ Torr (FIG. 1A).

Then, oxygen gas and argon gas are introduced in the chamber.

A c-axis oriented thin film of oxide superconductor $Y_1Ba_2Cu_3O_{7-x}$ (1) having a thickness of 300 nm is deposited on the substrate (3) of MgO (100) by off-axis sputtering method under following operational conditions:

Sputtering gas
Ar: 90%
$O_2$: 10%
Pressure: 10 Pa
Substrate temperature: 700° C.

After deposition complete, it is possible to carrying out heat-treatment of the thin film of oxide superconductor of $Y_1Ba_2Cu_3O_{7-x}$ (1) by adjusting the substrate temperature at around 400° C. so that oxygen atoms enter into the oxide.

Then, the atmosphere in the chamber is replaced with high-purity oxygen having a purity of 99.999%.

After then, the substrate temperature is elevated to 500° C. and a thin film of Au (2) is deposited up to a thickness of 200 nm on the thin film of oxide superconductor of $Y_1Ba_2Cu_3O_{7-x}$ (1) by evaporation method (FIG. 1C) under following conditions:

Atmosphere gas $O_2$: 100%
Pressure: 10 Pa,

Then, a patterned photo-resist layer (5) is formed on the thin film of Au (2) (FIG. 1D). Finally, both of the thin film of Au (2) and the thin film of oxide superconductor of $Y_1Ba_2Cu_3O_{7-x}$ (1) are etched by reacting ion etching technique (FIG. 1E).

All of the procedures are carried out in a single chamber successively. The layers prepared by the process according to the present invention possess improved crystallinity and show good lattice matching at an interface. No diffusion is observed at the interface.

EXAMPLE 4

Condition 2

Example 3 is repeated but deposition of the Au thin film is carried out in a separate chamber, so that the bottom superconductor layer has a contaminated surface.

Namely, after the bottom superconductor layer of $Y_1Ba_2Cu_3O_{7-x}$ (1) is deposited and after the optional heat-treatment at around 400° C. for trapping oxygen is finished, the substrate (3) is transferred into an ultra-high vacuum chamber. A surface of the bottom superconductor layer (1) is contaminated or deteriorated when the substrate (3) taken out of a sputtering chamber.

The bottom superconductor layer contaminated is placed in a ultra-high vacuum chamber which is then vacuumed at a pressure of lower than $1 \times 10^{-9}$ Torr. After that, the bottom superconductor layer (1) is heat-treated under following operational conditions:

Atmosphere: $O_2$ (purity of more than 5N, partial pressure of 25 Torr)
Heating temperature: 600° C. (substrate temperature)
Heating time: 10 min (after then, quenched in oxygen atmosphere), After the heat-treatment, a thin film of Au (2) is deposited up to a thickness of 200 nm by evaporation method (FIG. 1C). Then, a patterned photo-resist layer (5) is formed on the thin film of Au (2) (FIG. 1D).

Finally, both of the thin film of Au (2) and the thin film of oxide superconductor of $Y_1Ba_2Cu_3O_{7-x}$ (1) are etched by reacting ion etching technique (FIG. 1E).

The layers prepared by the process according to the present invention possess improved crystallinity and show an improved lattice matching at an interface even after the pattering operation.

We claim:
1. A process for patterning layered thin films comprising the steps of
   (a) heat-treating a bottom oxide superconductor layer which is on a substrate, in ultra high vacuum at a temperature which is lower than the oxygen-trap temperature at which oxygen can enter into said oxide superconductor but is higher than a temperature which is lower by 100° C. than said oxygen-trap temperature,
   (b) depositing another thin film which is an insulator, ordinary conductor, or oxide superconductor having a different crystal orientation from said bottom superconductor layer, on an entire surface of the heat-treated bottom superconductor layer, and
   (c) patterning said another thin film.

2. A process as set forth in claim 1 wherein said heat-treatment is carried out in ultra high-vacuum of lower than $1 \times 10^{-9}$ Torr.

3. A process as set forth in claim 1, wherein said bottom superconductor layer is a c-axis oriented thin film of $Y_1Ba_2Cu_3O_{7-x}$.

4. A process as set forth in claim 3, wherein said heat-treatment is carried out at a temperature between 350° and 400° C.

5. A process as set forth in claim 1, wherein said another thin film is made of non-superconductor.

6. A process as set forth in claim 5, wherein said non-superconductor comprises Au.

7. A process as set forth in claim 1, wherein prior to the heat treatment said bottom superconductor layer has a contaminated surface.

8. A process as set forth in claim 1, wherein said bottom superconductor layer is also patterned at the same time as the patterning of said another thin film.

9. A process as set forth in claim 1, wherein said substrate is a single oxide crystal.

10. A process as claimed in claim 1, wherein prior to the patterning, a photoresist is applied to said another thin film.

11. A process as claimed in claim 1, wherein steps (a) and (b) take place in a single chamber such that the surface of the bottom superconducting layer does not become contaminated during the process.

12. A process for patterning layered thin films comprising the steps of
(a) heat-treating a bottom oxide superconductor layer which is on a substrate, in an atmosphere containing oxygen of high purity at a temperature which is higher than the oxygen-trap temperature at which oxygen can enter into said oxide superconductor but is lower than a film forming temperature of said oxide superconductor,
(b) depositing another thin film which is an insulator, ordinary conductor, or oxide superconductor having a different crystal orientation from said bottom superconductor layer, on an entire surface of the heat-treated bottom superconductor layer, and
(c) patterning said another thin film.

13. A process as set forth in claim 12, wherein the purity of oxygen is higher than 5N (99.999%).

14. A process as set forth in claim 12, wherein a partial pressure of oxygen during the heat-treatment is between 20 mTorr and 100 mTorr.

15. A process as set forth in claim 12, wherein said bottom superconductor layer is a c-axis oriented thin film of $Y_1Ba_2Cu_3O_{7-x}$.

16. A process as set forth in claim 15, wherein said heat-treatment is effected at a temperature between 400° and 700° C.

17. A process as set forth in claim 12, wherein said another thin film is made of non-superconductor.

18. A process as set forth in claim 17, wherein said non-superconductor comprises Au.

19. A process as set forth in claim 12, wherein said bottom superconductor layer is also patterned at the same time as the patterning of said another thin film.

20. A process as set forth in claim 12, wherein prior to the heat treatment said bottom superconductor layer has a contaminated surface and said heat-treatment is effected above an evaporation temperature of contaminants.

21. A process as set forth in claim 12, wherein said substrate is a single oxide crystal.

22. A process as claimed in claim 12, wherein prior to the patterning, a photoresist is applied to said another thin film.

23. A process as claimed in claim 12, wherein steps (a) and (b) take place in a single chamber such that the surface of the bottom superconducting layer does not become contaminated during the process. D

* * * * *